(12) United States Patent
Liu et al.

(10) Patent No.: US 11,610,559 B2
(45) Date of Patent: Mar. 21, 2023

(54) SHIFT REGISTER UNIT AND THRESHOLD VOLTAGE COMPENSATION METHOD THEREOF, DRIVING CIRCUIT AND DISPLAY APPARATUS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Xingyi Liu, Beijing (CN); Yongxian Xie, Beijing (CN); Wei Feng, Beijing (CN); Yanchun Lu, Beijing (CN); Jideng Zhou, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 416 days.

(21) Appl. No.: 16/836,295

(22) Filed: Mar. 31, 2020

(65) Prior Publication Data

US 2021/0035517 A1 Feb. 4, 2021

(51) Int. Cl.
*G09G 3/36* (2006.01)
*G11C 19/28* (2006.01)

(52) U.S. Cl.
CPC .......... *G09G 3/3677* (2013.01); *G11C 19/28* (2013.01); *G09G 2310/0286* (2013.01); *G09G 2320/02* (2013.01)

(58) Field of Classification Search
None
See application file for complete search history.

(56) References Cited

U.S. PATENT DOCUMENTS

| 10,475,362 | B2* | 11/2019 | Wang | G11C 19/28 |
| 2016/0118003 | A1* | 4/2016 | Dai | G09G 3/3677 |
| | | | | 345/91 |
| 2020/0027515 | A1* | 1/2020 | Gu | G09G 3/3677 |

FOREIGN PATENT DOCUMENTS

| CN | 104078022 A | 10/2014 |
| CN | 105206243 A | 10/2015 |

(Continued)

OTHER PUBLICATIONS

First Chinese Office Action dated Sep. 26, 2021, for corresponding Chinese Patent Application No. 201910708110.6.

*Primary Examiner* — Amare Mengistu
*Assistant Examiner* — Sarvesh J Nadkarni
(74) *Attorney, Agent, or Firm* — Kinney & Lange, P.A.

(57) ABSTRACT

The present disclosure discloses a shift register unit and a threshold voltage compensation method thereof, a driving circuit and a display apparatus. The shift register unit includes a cascaded output circuit coupled to a pull-up node, a clock signal input terminal, and a cascaded signal output terminal. The shift register unit is configured to transmit a clock signal from the clock signal input terminal to the cascaded signal output terminal under control of the pull-up node. A compensation circuit has a voltage output terminal coupled to the pull-up node, and is configured to provide an output voltage signal through the voltage output terminal during a blanking phase of a frame. The output voltage signal drives reverse drift of a threshold voltage of the cascaded output circuit.

9 Claims, 4 Drawing Sheets

(56) References Cited

FOREIGN PATENT DOCUMENTS

| | | |
|---|---|---|
| CN | 106356015 A | 1/2017 |
| CN | 106847221 A | 6/2017 |
| CN | 10887716 A | 11/2018 |
| CN | 108962330 A | 12/2018 |
| JP | 2009168969 A | 7/2009 |
| KR | 20160068081 A | 6/2016 |

* cited by examiner

SHIFT REGISTER UNIT AND THRESHOLD VOLTAGE COMPENSATION METHOD THEREOF, DRIVING CIRCUIT AND DISPLAY APPARATUS

CROSS-REFERENCE TO RELATED APPLICATION

This application claims priority to the Chinese Patent Application No. CN 201910708110.6, filed on Aug. 1, 2019, which is incorporated herein by reference in its entirety.

BACKGROUND

The present disclosure generally relates to the field of display technology, and more particularly to a shift register unit and a threshold voltage compensation method thereof, and to a driving circuit and a display apparatus.

Gate Driver on Array (GOA) technology is increasingly used in Liquid Crystal Display (LCD) applications to achieve desirable features such as reduced cost, narrow bezel, etc. Current GOA products, however, are plagued by abnormal display issues when displays remain lit for an extended time. Specifically, forward drifts of threshold voltages of some transistors in a GOA region over extended periods results in reduced operating current, causing cascaded output signals to be attenuated stage by stage, causing display abnormalities.

SUMMARY

In a first aspect of the embodiments of the present disclosure, there is provided a shift register unit, comprising:

a cascaded output circuit coupled to a pull-up node, a clock signal input terminal and a cascaded signal output terminal, and configured to transmit a clock signal from the clock signal input terminal to the cascaded signal output terminal under control of the pull-up node; and a compensation circuit having a voltage output terminal coupled to the pull-up node, wherein the compensation circuit is configured to provide an output voltage signal through the voltage output terminal during a blanking phase of a frame, wherein the output voltage signal drives a threshold voltage of the cascaded output circuit to drift reversely.

In an embodiment, the compensation circuit is configured to cause the voltage output terminal to be floating during a display phase of the frame.

In an embodiment, the compensation circuit comprises a switch unit electrically coupled between a voltage input terminal of the compensation circuit and the voltage output terminal, and configured to be turned on or turned off in response to an input voltage signal provided at the voltage input terminal.

In an embodiment, the switch unit is configured to be turned on during the blanking phase of the frame in response to the input voltage signal provided at the voltage input terminal.

In an embodiment, the switch unit is configured to be turned off during the display phase of the frame in response to the input voltage signal provided at the voltage input terminal.

In an embodiment, the switch unit is a diode.

In an embodiment, the diode has an anode coupled to the voltage input terminal, and a cathode coupled to the voltage output terminal.

In an embodiment, the cascaded output circuit comprises a transistor having a gate electrically coupled to the voltage output terminal, a first electrode coupled to the clock signal input terminal, and a second electrode electrically coupled to the cascaded signal output terminal.

In an embodiment, the transistor is an NMOS transistor, and a gate voltage of the transistor is less than a source voltage of the transistor during the blanking phase of the frame.

In an embodiment, the transistor is a PMOS transistor, and a gate voltage of the transistor is less than a source voltage of the transistor during the blanking phase of the frame.

In an embodiment, an absolute value of a gate-source voltage of the transistor is 14V to 16V during the blanking phase of the frame.

In a second aspect of the embodiments of the present disclosure, there is provided a gate driving circuit comprising a plurality of cascaded shift register units described above.

In a third aspect of the embodiments of the present disclosure, there is provided a display apparatus comprising a display panel and the gate driving circuit described above.

In a fourth aspect of the embodiments of the present disclosure, there is provided a threshold voltage compensation method for the shift register unit described above, comprising: controlling, during a blanking phase of a frame, to provide an output voltage signal to the voltage output terminal of the cascaded output circuit, to drive a threshold voltage of the cascaded output circuit to drift reversely, and controlling, during a display phase of the frame, the voltage output terminal to be floating.

The present summary is provided only by way of example, and not limitation. Other aspects of the present disclosure will be appreciated in view of the entirety of the present disclosure, including the entire text, claims, and accompanying figures.

Figure 1:
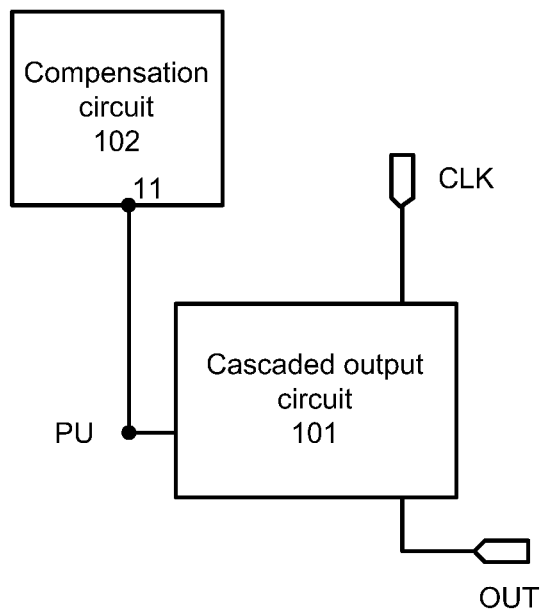
FIG. 1 is a schematic structural diagram of a shift register unit according to an embodiment of the present disclosure.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

The present disclosure is described in detail below with reference to the accompanying drawings and discussion focused on particular embodiments. It may be understood that the specific embodiments described here are only used to explain the related disclosure, rather than limiting the present disclosure. It should also be understood that, for convenience of description, generally only parts related to the present disclosure are shown in the accompanying drawings. Embodiments and features of embodiments described herein may be combined with each other without conflict.

As are presented below through discussion of particular embodiments of the present disclosure, a compensation circuit drives a threshold voltage of a transistor to drift reversely during a blanking phase of a frame, so as to correct an offset due to a forward drift of the threshold voltage of the transistor for a long time during a display phase of the frame. This permits a display apparatus to display normally, which can prevent undesirable forward drifts of threshold voltages of some transistors in existing GOA products over time. This approach thus avoids problems such as reduced operating current and cascaded output signals that are attenuated stage-by-stage to cause display abnormalities.

In one embodiment of the present disclosure, as shown in FIG. 1, a shift register unit 100 comprises a cascaded output circuit 101 and a compensation circuit 102.

The cascaded output circuit 101 is coupled to a pull-up node PU, a clock signal input terminal CLK, and a cascaded signal output terminal OUT, and is configured to transmit a clock signal from the clock signal input terminal CLK to the cascaded signal output terminal OUT under control of the pull-up node PU.

A voltage output terminal 11 of the compensation circuit 102 is coupled to the pull-up node PU. The compensation circuit 102 is configured to provide an output voltage signal through the voltage output terminal 11 during a blanking phase of a frame, wherein the output voltage signal drives a threshold voltage of the cascaded output circuit 101 to drift reversely.

In the embodiment of the present disclosure, the blanking phase is a phase from a time when the pixel driving circuit drives one row of pixels to be scanned completely to a time when the pixel driving circuit starts to drive a next row of pixels to be scanned, or is a phase from a time when the pixel driving circuit drives a frame of image to be displayed completely to a time when the pixel driving circuit starts to drive a next frame of image to be displayed. The output voltage signal drives a threshold voltage of a transistor in the cascaded output circuit 101 to drift reversely. The reverse drift here is relative to a forward drift during a normal operation of the transistor. Description will be made in detail by taking the transistor being an NMOS transistor as an example. During a normal operation of the NMOS transistor, a gate voltage is greater than a source voltage, and after the NMOS transistor operates for a long time, a threshold voltage may have a forward drift, that is, the threshold voltage may become large, which results in abnormal display. During a blanking phase of a frame, the voltage output terminal outputs a voltage signal, which may not affect normal display of the display apparatus, and drives the threshold voltage of the transistor to be compensated to drift reversely, to correct an offset due to the forward shift of the threshold voltage of the transistor for a long time, so that the display apparatus may display normally.

Further, the voltage output terminal 11 is configured to be floating during the display phase of the frame, to prevent the voltage output terminal from outputting the voltage signal to the transistor during the display phase of one frame, which prevents the compensation circuit from affecting the normal display of the display apparatus, and improves reliability of the display apparatus.

Figure 2:
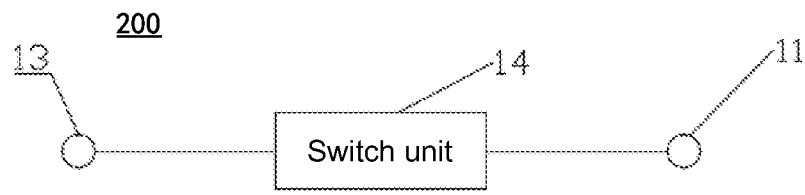
FIG. 2 is a schematic structural diagram of a compensation circuit according to an embodiment of the present disclosure.

FIG. 2 illustrates a specific structural diagram of the compensation circuit in FIG. 1. As shown in FIG. 2, the compensation circuit 200 further comprises a voltage input terminal 13 and a switch unit 14. The switch unit 14 is electrically coupled between the voltage input terminal 13 and the voltage output terminal 11. The switch unit 14 is configured to be turned on during the blanking phase of a frame in response to an input voltage signal provided at the voltage input terminal 11.

Further, the switch unit 14 is configured to be turned off during the display phase of the frame in response to the input voltage signal provided at the voltage input terminal 11.

In the embodiment of the present disclosure, the voltage input terminal is used to provide the input voltage signal. When the voltage input terminal provides different voltage signals, the switch unit may be in a turn-on state or a turn-off state. Description will be made in detail by taking the transistor to be compensated being an NMOS transistor as an example. The voltage input terminal is coupled to a gate of the transistor to be compensated. When an absolute value of the voltage provided at the voltage input terminal is less than the voltage at the voltage output terminal during the display phase of the frame, the switch unit is turned off and the voltage output terminal is floating to avoid affecting the normal display of the display apparatus. When the absolute value of the input voltage provided at the voltage input terminal is greater than the voltage at the voltage output terminal during the blanking phase of the frame, the switch unit is turned on, to transmit the input voltage signal from the voltage input terminal to the voltage output terminal, to drive the threshold voltage of the transistor to be compensated to drift reversely, so as to correct the offset due to the forward shift of the threshold voltage of the transistor for a long time, so that the display apparatus may display normally.

Figure 5:
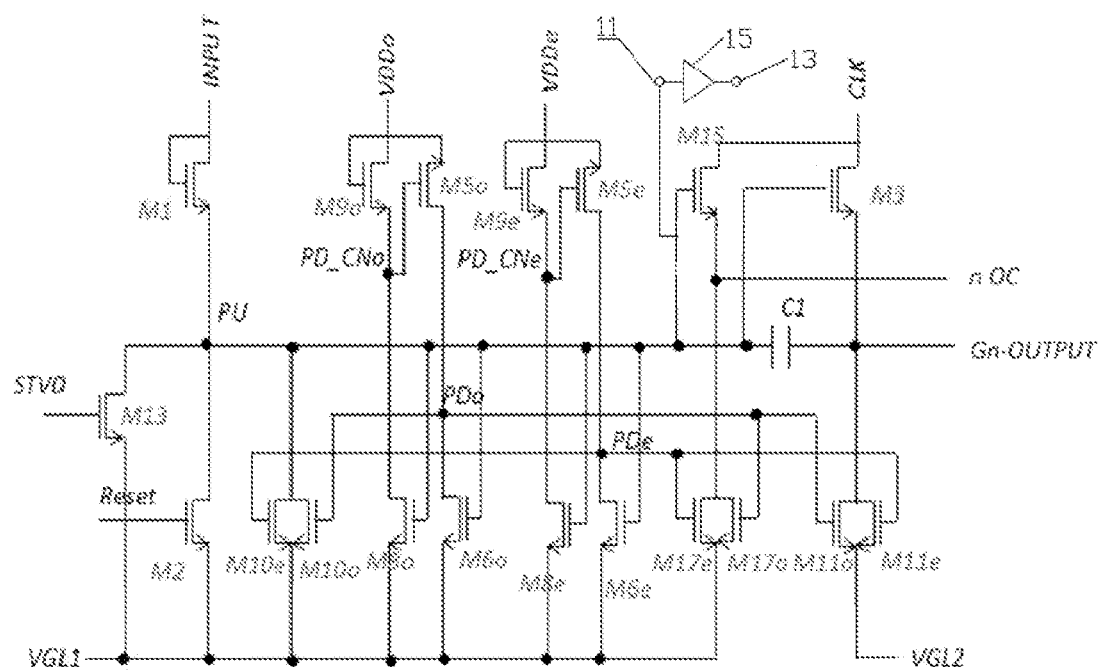
FIG. 5 is a schematic structural diagram of a shift register unit according to an embodiment of the present disclosure.

Further, the switch unit 14 is a diode 15, which has a simple structure, and is convenient for production. As shown in FIG. 5, description will be made in detail by taking the transistor to be compensated being an NMOS transistor as an example. The diode has a positive electrode electrically coupled to the voltage input terminal, and a negative electrode electrically coupled to the voltage output terminal which is coupled to the gate of the transistor to be compensated. When the switch unit needs to be turned off during the display phase of the frame, the input voltage provided at the voltage input terminal is controlled to be less than the voltage at the voltage output terminal, and the diode is turned off at this time; and when the switch unit needs to be turned on during the blanking phase of the frame, the absolute value of the input voltage provided at the voltage input terminal is controlled to be greater than the voltage at the voltage output terminal, and the diode is turned on at this time, to transmit the input voltage to the voltage output terminal, to drive the threshold voltage of the transistor to be compensated to drift reversely, so as to correct the offset due to the forward drift of the threshold voltage of the transistor for a long time, so that the display apparatus may display normally.

Figure 3:
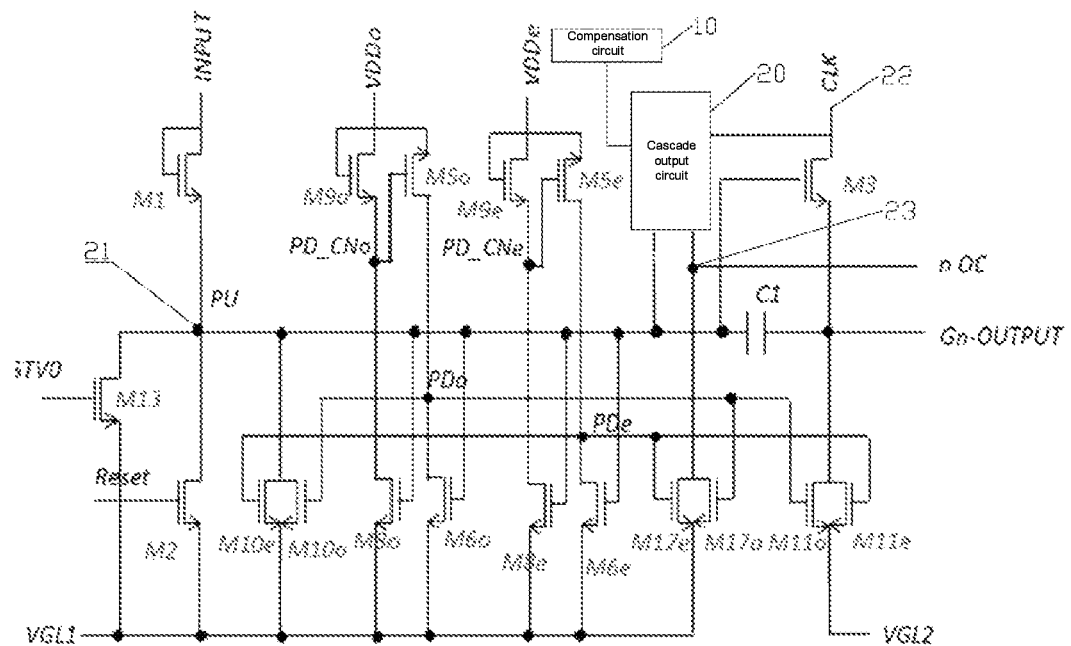
FIG. 3 is a schematic structural diagram of a shift register unit according to an embodiment of the present disclosure.

As shown in FIG. 3, in another embodiment of the present disclosure, a shift register unit comprises a cascaded output circuit 20 and a compensation circuit 10. The cascaded output circuit 20 is electrically coupled to a pull-up node 21, a clock signal input terminal 22, and a cascaded signal output terminal 23, and the pull-up node 21 is electrically coupled to a voltage output terminal 11.

In the embodiment of the present disclosure, the cascaded output circuit is electrically coupled to the pull-up node PU, the clock signal input terminal CLK, and the cascaded signal output terminal nOc. The cascaded signal output circuit may provide a clock signal at the clock signal input terminal CLK to the cascaded signal output terminal nOc in response to a voltage signal at the pull-up node PU. The cascaded signal output terminal is coupled to a cascaded signal input terminal of a next stage of shift register unit. The voltage output terminal of the compensation circuit is coupled to the pull-up node, to compensate for the cascaded output circuit during a blanking phase of a frame, so that a threshold voltage of a transistor in the cascaded output circuit drifts reversely.

Figure 6:
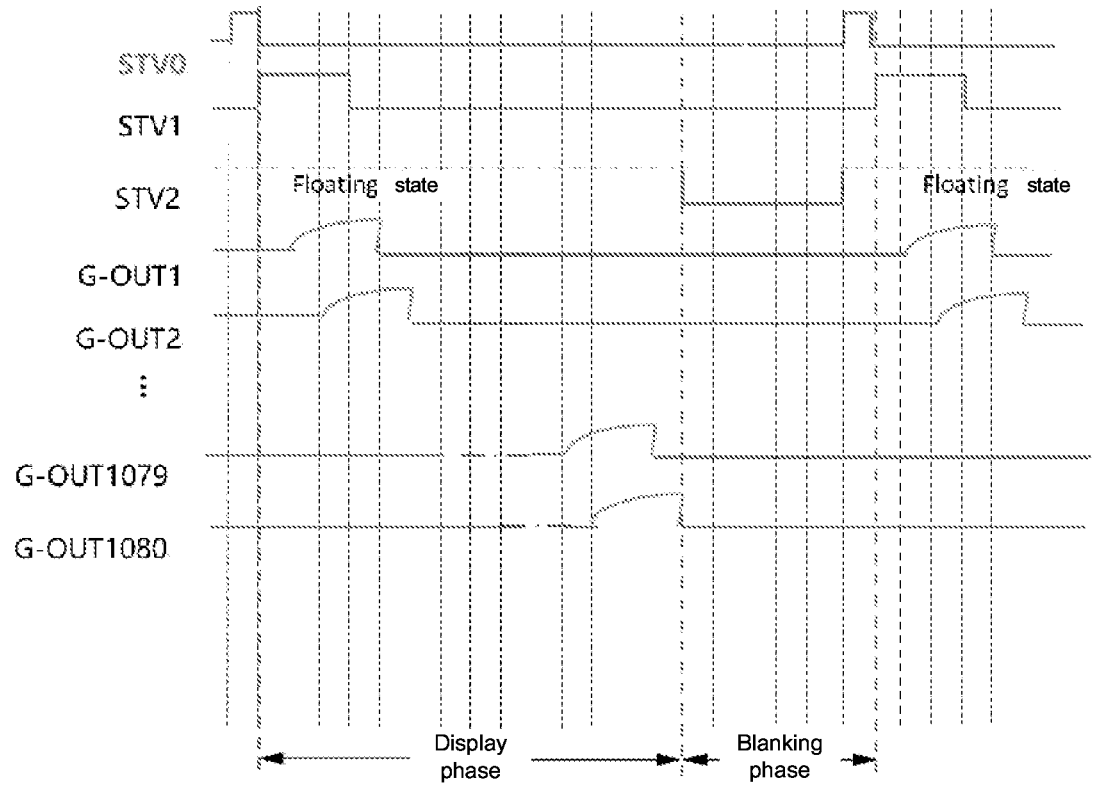
FIG. 6 is a timing diagram of the shift register unit shown in FIG. 3.

As shown in FIG. 6, illustrated is a timing diagram of a shift register unit, in which STV2 is a voltage signal at a voltage output terminal of a compensation circuit, and a transistor in a cascaded output circuit is an NMOS transistor, the voltage output terminal of the compensation circuit is in a floating state during a display phase of the frame, and provides a negative voltage to the gate of the transistor during a blanking phase of one frame, so that a threshold voltage of the transistor drifts reversely.

Figure 4:
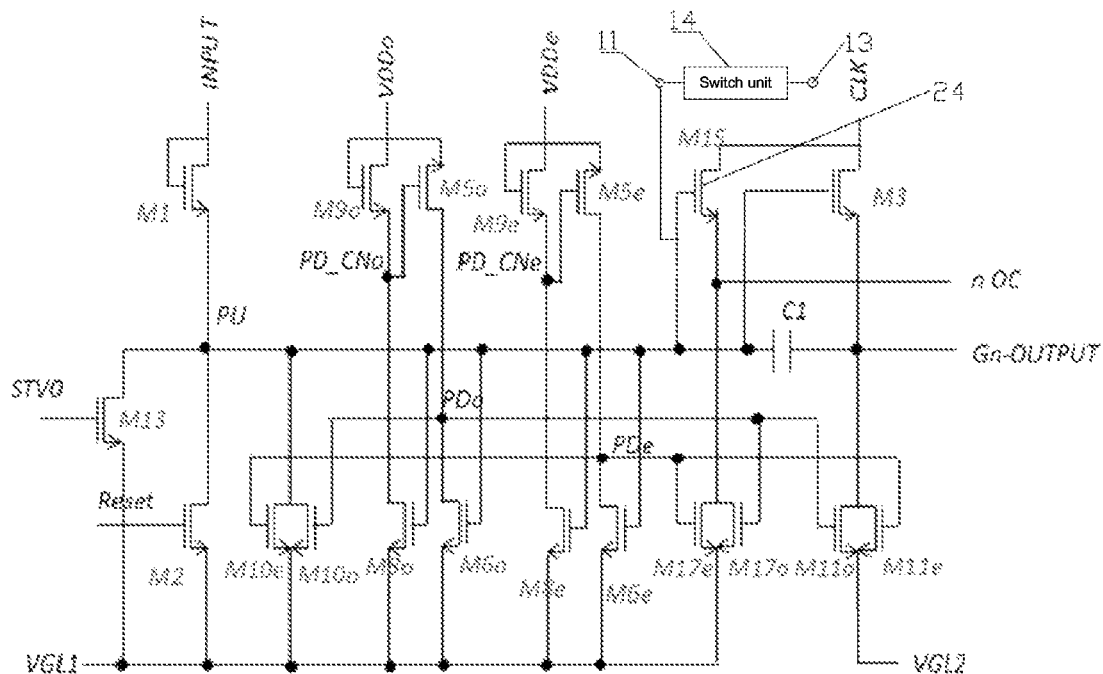
FIG. 4 is a schematic structural diagram of a shift register unit according to an embodiment of the present disclosure.

Further, as shown in FIG. 4, the cascaded output circuit 20 comprises a transistor 24 having a gate electrically coupled to the voltage output terminal 11, a first electrode electrically coupled to the clock signal input terminal 22, and a second electrode electrically coupled to the cascaded signal output terminal 23.

In the embodiment of the present disclosure, the drain of the transistor may be electrically coupled to the clock signal input terminal, and the source of the transistor may be electrically coupled to the cascaded signal output terminal, but the present disclosure is not limited thereto. The voltage output terminal is electrically coupled to the gate of the transistor, and the compensation circuit compensates for the transistor during the blanking phase of the frame, so that when the threshold voltage of the transistor drifts reversely, the voltage signal output at the voltage output terminal is prevented from affecting the gate driving circuit which may otherwise cause the display apparatus to display abnormally, thereby improving the reliability of the display apparatus.

Further, the transistor 24 is an NMOS transistor. During the blanking phase of the frame, a gate voltage of the transistor 24 is less than a source voltage of the transistor 24.

In the embodiment of the present disclosure, when the transistor is an NMOS transistor, in order to enable the display apparatus to display normally during the display phase of the frame, the gate voltage of the transistor is greater than the source voltage of the transistor. After the display apparatus is lit up for a long time, the threshold value of the transistor may drift forwardly, which results in abnormal display. During the blanking phase of the frame, the gate voltage of the transistor is less than the source voltage of the transistor, which causes the threshold voltage of the transistor to drift reversely, to correct the forward drift of the threshold voltage of the transistor during the display phase, thereby enabling the display apparatus to display normally.

Further, the transistor 24 is a PMOS transistor. During the blanking phase of the frame, the gate voltage of the transistor 24 is greater than the source voltage of the transistor 24.

In the embodiment of the present disclosure, when the transistor is a PMOS transistor, in order to enable the display apparatus to display normally during the display phase of the frame, the gate voltage of the transistor is less than the source voltage of the transistor. After the display apparatus is lit up for a long time, the threshold voltage of the transistor may drift forwardly, which results in abnormal display. During the blanking phase of the frame, the gate voltage of the transistor is greater than the source voltage of the transistor, which causes the threshold voltage of the transistor to drift reversely, to correct the forward drift of the threshold voltage of the transistor during the display phase, thereby enabling the display apparatus to display normally.

Further, during the blanking phase of a frame, an absolute value of a gate-source voltage of the transistor 24 is 14V to 16V. During the blanking phase of the frame, the threshold voltage of the transistor is corrected, so that when the threshold voltage drifts reversely, if the transistor is an NMOS transistor, the gate-source voltage is −16V to −14V; and if the transistor is a PMOS transistor, the gate-source voltage is 14V to 16V. The absolute value of the gate-source voltage is 14V to 16V, which may not only ensure the effect of correcting the forward drift of the threshold voltage of the transistor by the compensation circuit, but also may reduce the influences on the display apparatus without excessively increasing power consumption of the display apparatus.

In yet another embodiment of the present disclosure, a gate driving circuit comprises a plurality of cascaded shift register units. Except for a first stage of shift register unit, each stage of shift register unit receives an output signal from an output signal terminal of a previous stage of shift register unit as an input signal of a current stage of shift register unit, and a first stage of shift register unit receives a frame start signal as an input signal.

In still another embodiment of the present disclosure, a display apparatus comprises a gate driving circuit and a display panel.

Figure 7:
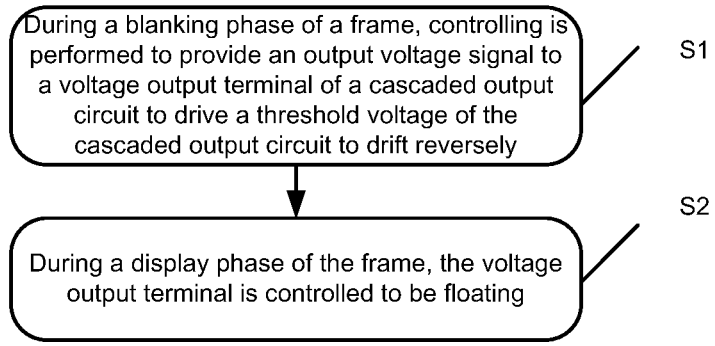
FIG. 7 is a flowchart of a threshold voltage compensation method for a shift register unit according to an embodiment of the present disclosure.

FIG. 7 illustrates a flowchart of a threshold voltage compensation method 700 for a shift register unit according to an embodiment of the present disclosure. As shown in FIG. 7, the method 700 comprises the following steps.

In step S1, during a blanking phase of a frame, controlling is performed to provide an output voltage signal to a voltage output terminal of a cascaded output circuit to drive a threshold voltage of the cascaded output circuit to drift reversely.

In step S2, during a display phase of the frame, the voltage output terminal is controlled to be floating.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

The invention claimed is:

1. A shift register comprising:
a cascaded output circuit coupled to a pull-up node, a clock signal input terminal, and a cascaded signal output terminal, and configured to transmit a clock signal from the clock signal input terminal to the cascaded signal output terminal under control of the pull-up node; and a compensation circuit having a voltage output terminal coupled to the pull-up node, wherein the compensation circuit is configured to provide an output voltage signal through the voltage output terminal during a blanking phase of a frame, wherein the output voltage signal drives a reverse drift of a threshold voltage of the cascaded output circuit, wherein the compensation circuit comprises a switch electrically coupled between a voltage input terminal of the compensation circuit and the voltage output terminal, and configured to be turned on or turned off in response to an input voltage signal provided at the voltage input terminal, wherein the switch is a diode, wherein the diode has an anode coupled to the voltage input terminal, and a cathode coupled to the voltage output terminal, wherein the cascaded output circuit comprises a transistor having a gate electrically coupled to the voltage output terminal, a first electrode coupled to the clock signal input terminal, and a second electrode electrically coupled to the cascaded signal output terminal, and wherein an absolute value of a gate-source voltage of the transistor is 14V to 16V during the blanking phase of the frame.

2. The shift register according to claim 1, wherein the compensation circuit is configured to cause the voltage output terminal to be floating during a display phase of the frame.

3. The shift register according to claim 1, wherein the switch is configured to be turned on during the blanking phase of the frame in response to the input voltage signal provided at the voltage input terminal.

4. The shift register according to claim 3, wherein the switch is configured to be turned off during the display phase of the frame in response to the input voltage signal provided at the voltage input terminal.

5. The shift register according to claim 1, wherein the transistor is an NMOS transistor, and wherein a gate voltage of the transistor is less than a source voltage of the transistor during the blanking phase of the frame.

6. The shift register according to claim 1, wherein the transistor is a PMOS transistor, and wherein a gate voltage of the transistor is less than a source voltage of the transistor during the blanking phase of the frame.

7. A gate driving circuit comprising a plurality of cascaded shift registers according to claim 1.

8. A display apparatus comprising a display panel and the gate driving circuit according to claim 7.

9. A threshold voltage compensation method for the shift register according to claim 1, comprising:

controlling, during a blanking phase of a frame, to provide an output voltage signal to the voltage output terminal of the cascaded output circuit that drives reverse drift of a threshold voltage of the cascaded output circuit, and controlling the voltage output terminal to be floating during a display phase of the frame.

* * * * *